United States Patent [19]

Voss

[11] 4,074,259

[45] Feb. 14, 1978

[54] PROCESS FOR ANALOG/DIGITAL CONVERSION

[76] Inventor: Joachim Voss, Leisanstrasse 14, 8000 Munich 60, Germany

[21] Appl. No.: 680,162

[22] Filed: Apr. 26, 1976

[30] Foreign Application Priority Data

Apr. 28, 1975 Germany .............................. 2518914

[51] Int. Cl.² ........................................... H03K 13/20
[52] U.S. Cl. ............................................. 340/347 AD
[58] Field of Search .... 340/347 M, 347 AD, 347 NT, 340/347 DA

[56] References Cited

U.S. PATENT DOCUMENTS

| 3,163,849 | 12/1964 | Meyer | 340/347 AD |
| 3,435,196 | 3/1969 | Schmid | 340/347 DA |
| 3,631,468 | 12/1971 | Spaid | 340/347 AD |

*Primary Examiner*—Charles D. Miller
*Attorney, Agent, or Firm*—Allegretti, Newitt, Witcoff & McAndrews

[57] ABSTRACT

A programmable analog-to-digital conversion system having a response characteristic which may be shaped as desired by selectively supplying digital control signals to a field effect transistor which controls the charging of a timing capacitor from a constant current source. The capacitor is thus charged at a non-linear rate (determined by the programming) toward a threshold value established by the magnitude of the analog input signal. As the capacitor is being charged, a counter is incremented. When the capacitor charge reaches the threshold value, the final count is displayed by an output device.

8 Claims, 7 Drawing Figures

$z \approx U_e$ $z \not\approx U_e$

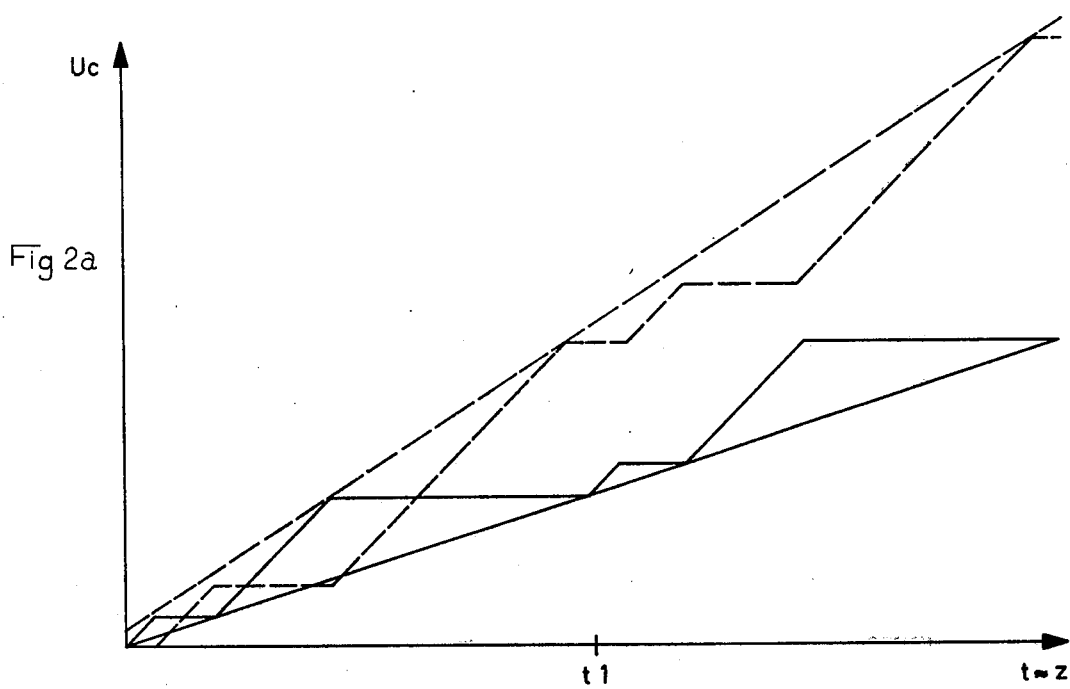
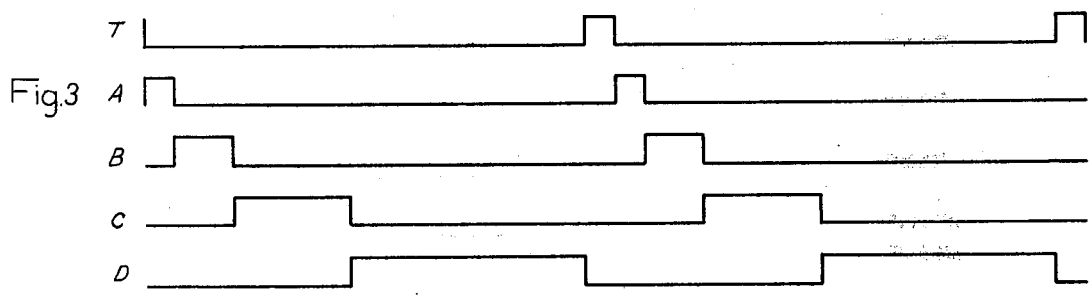
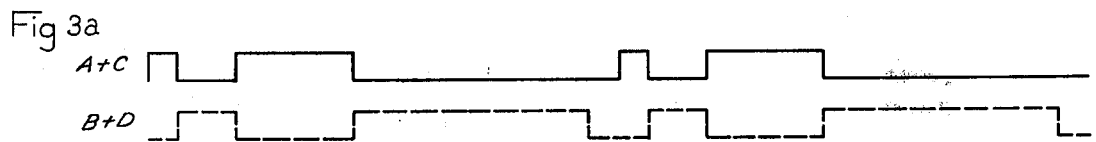

4,074,259

PROCESS FOR ANALOG/DIGITAL CONVERSION

SUMMARY OF THE INVENTION

The invention relates to a process for analog to digital conversion with a programmable response.

A well-known method of analog-digital conversion is the use of a step generator and a comparator to generate pulses whose number is proportional to an analog input voltage. These converters are linear and, normally, only their gain is adjustable.

If, for example, a temperature is to be measured, and the electrical signal from the sensor is not proportional to the temperature, a complex analog circuitry is very often needed to compensate for the distortion before the analog signal is applied to a linear A/D converter to arrive at a digital display.

It is thus an object of the present invention to provide a system for displaying a physical value on a digital display, even if the physical value and the electrical value on the output of the sensor are non-proportional.

In accordance with the invention, a digital signal is generated to establish time periods during which a capacitor is charged with a constant current, and the voltage on this capacitor is then compared with the analog input voltage. At the same time, a signal is generated which pulses a counter, and pulses T1 to Tm are generated in a way that the quotient T1/t to Tm/t determines the number of steps of same amplitude, and the interaction of signals A to D, etc., and T1 to Tm generate a pulse chain which controls a field effect transistor which switches a constant current onto the capacitor such that the voltage on the capacitor increases with reference to time in a non-linear manner. Also, a comparator compares the voltage across the capacitor with the input voltage of the analog signal and, when these voltages are equal, the comparator stops the pulses which were controlling the counter. The total count may then be displayed on a digital display.

Preferably, the signals A to D, etc., are switched by cross-bar contacts into OR-gates in a way that every OR-gate can be freely coded.

It is an advantage for the coding to use electrical contacts or solid-state switches, like light-responsive semiconductors, so that the contacts in the coding area may be programmed with a punch card. Alternatively, it follows that coding may be performed by other electrical cross-connecting means.

According to a further feature of the invention, linear digital display of a non-linear analog signal may be achieved by simple digital coding. At the same time, the digital coding is freely selectable without losing accuracy of the system. The programming is accomplished with simple technical means and can be easily adapted to all kinds of response curves between physical values and electrical values of the sensor's output.

BRIEF DESCRIPTION OF THE DRAWINGS

In the description which follows, one example of an application of the principles of the invention will be described, reference being made to the attached drawings in which:

FIG. 2a illustrates a part of the response curve shown in FIG. 2;

FIG. 3 illustrates the waveform of the digital timing signals, T, A, B, C and D;

FIG. 3a illustrates two examples of interconnections of the signals A, B, C and D;

DESCRIPTION OF THE PREFERRED EMBODIMENT

Figure 1:
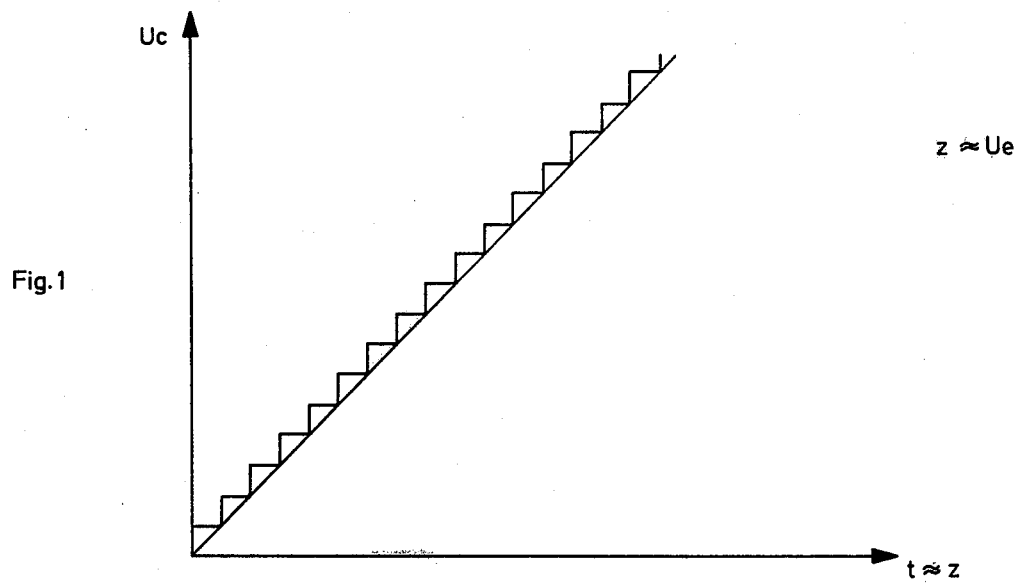
FIG. 1 shows the response curve of a linear analog/digital converter.

In FIG. 1, the response curve of a known A/D converter is shown. Using the conventional combination of a step generator and a comparator, the number of output pulses generated (Uc) is proportional to the voltage of the analog input signal $V_e$.

Figure 2:
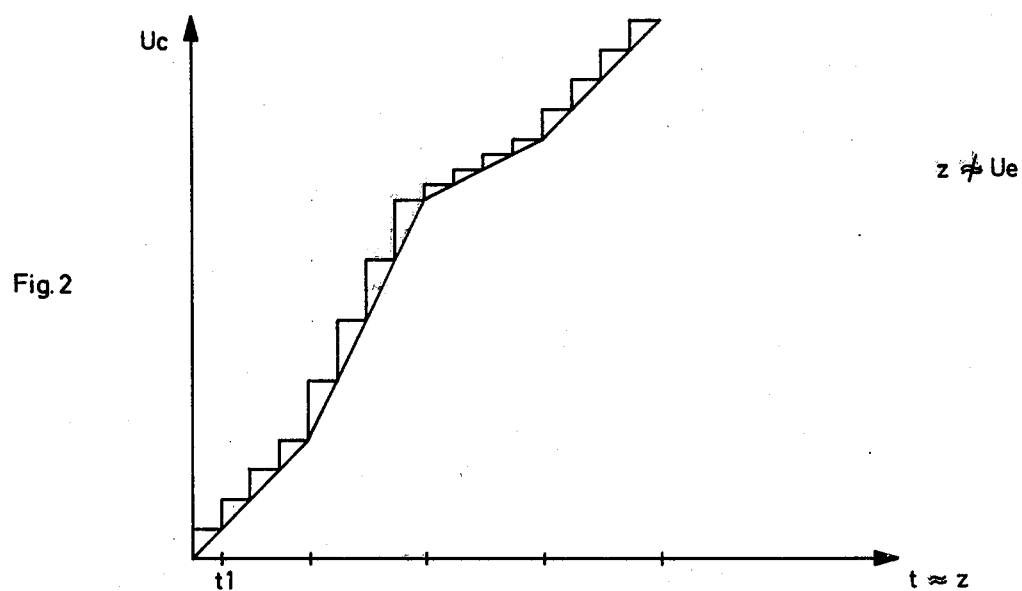
FIG. 2 shows the response curve of a converter employing the principles of the present invention.

In FIG. 2, the response curve is shown of an A/D converter with non-linear response curve according to the present invention. There are four steps of period $t_1$ having the same amplitude. In the example shown, the response curve changes its gain after each of the periods T1, T2, T3, T4 (see also FIG. 4). In FIG. 2a, it is shown how the first step of the period $t_1$ (FIG. 2) is made up. The solid straight line 21 shows the charge on the capacitor 23 (shown in FIG. 5) up to the voltage $V_{c1}$ during the period $t_1$ if the coding interconnects the signals A and B according to FIGS. 3 and 3a. The dotted line 22 shows the charge on the capacitor C up to the voltage $V_{c2}$ during the period $t_1$, if the signals B and D are interconnected according to FIGS. 3 and 3a. Using the appropriate interconnection of signals A, B, C and D, the desired amplitude of $V_c$ in the period of $t_1$ is reached and is thus programmable.

Figure 4:
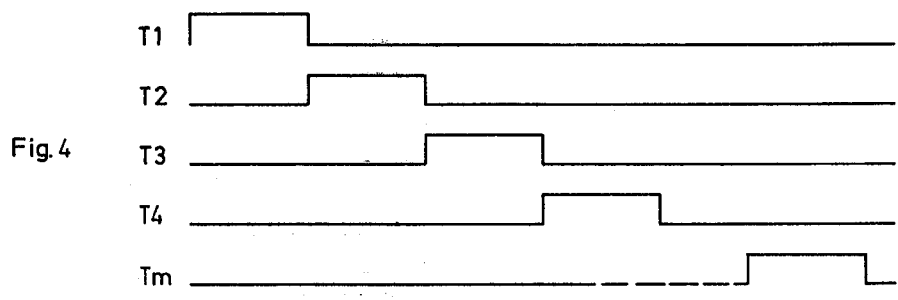
FIG. 4 shows the waveform of the signals T1 to Tm.
Figure 5:
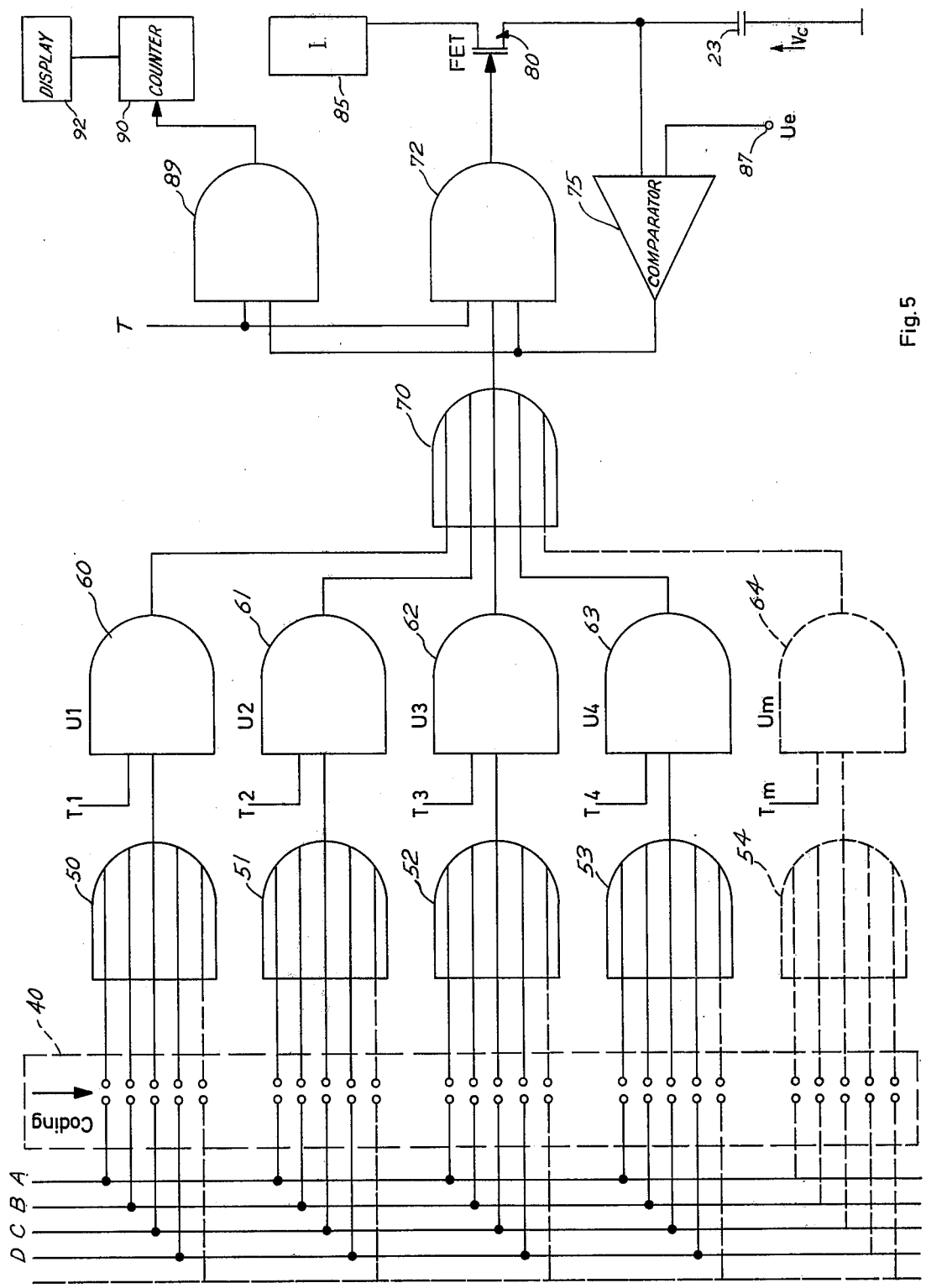
FIG. 5 is a block diagram of a preferred embodiment of the present invention.

In FIG. 4, the signals T1 to Tm are shown. Signals T1 to Tm are applied to terminals 31 to 35 as seen in FIG. 5 and determine the range of that part of the response curve in which the steps have the same amplitude. The number of units $t_1$ included in the period T1, T2, T3 or Tm, etc., determines the accuracy of the response curve of the converter.

Digital electronic circuitry, including oscillators, counters and gates (not shown) may be employed to generate the signals T, A, B, C, D, etc. The signals T1, T2, T3, T4 or Tm are produced in the same way. According to the required amplitude of a step, the electrical contacts 40, seen in FIG. 5, will be coded for the appropriate interconnection of the signals A, B, C, D, etc., and switched onto the output of the OR-gates 50 to 54.

FIG. 2 shows an example in which it is assumed that the amplitude of each of four steps in a group should be the same. The output of the OR-gate 50 to 54 are connected to the AND-gates 60 to 64, which also receive the signals T1 to Tm on their inputs (31 to 35, respectively).

During the period T1, T2, T3 or Tm, the output of the AND-gates 60 to 64 is therefore that signal which has been composed from the signals A, B, C, D, etc., for the appropriate time period T1, T2, T3 to Tm.

The output of all AND-gates 60 to 64 are connected to the following OR-gates 70 and then fed to the input of the next AND-gate 72, which also receives the signal T and the output signal of a comparator 75.

The output signal of the AND-gate 72 is a pulse chain which controls the field effect transistor (FET) 80 which switches a constant direct current from the current source 85 onto the capacitor 23 by impulses.

When the voltage on the capacitor 23 reaches the same amplitude as the analog input voltage $V_e$ (applied to terminal 87), the comparator 75 will switch off the AND-gate 72 and thus stop the control signal for the FET. At the same time the input of the AND-gate 89 is locked and the signal T is no longer passed onto the counter 90, thus the display 92 remains constant.

What is claimed is:

1. An analog-to-digital conversion system having a programmable response curve which comprises, in combination:

a timing capacitor;
   an input circuit for receiving an analog input signal;
   means for generating a train of pulses for establishing successive time intervals T1 through T$m$;
   a source of digital signals for establishing, within each of said intervals, subintervals during which said timing capacitor is charged;
   a counter;
   means for generating $t$ pulses per second for incrementing said counter such that said counter is incremented T1/$t$ through T$M$/$t$ times during each of said intervals T1 through T$m$ respectively;
   means for interconnecting said digital signals and said train of pulses to produce a control signal;
   a constant current source;
   a field effect transistor connected to switch current from said source onto said timing capacitor in response to said control signal;
   a comparator for terminating the operation of said counter when the voltage across said capacitor exceeds a threshold level established by said analog input voltage; and
   output means for displaying the count present on said counter.

2. A system set forth in claim 1 wherein said means for interconnecting includes a plurality of OR-gates having their input terminals connected to selected ones of said digital signals by means of programmable switching means.

3. A system according to claim 2 wherein said switching means are electrical contacts.

4. A system according to claim 2 wherein said switching means are light-responsive semiconductor switches.

5. A system according to claim 2 wherein said switching means may be selectively opened and closed by holes selectively present at corresponding positions on a punch card.

6. A system according to claim 2 wherein said switching means comprise fixed electrical connections.

7. In combination:

a timing capacitor;
   a source of an analog input signal;
   a source of regularly spaced primary timing signals for establishing a sequence of primary time intervals;
   a source of secondary timing signals for establishing subintervals within each of said primary time intervals;
   programmable interconnecting means associated with each of said primary time intervals for charging said timing capacitor during selected ones only of said subintervals;
   a counter; and
   means for repetitiously incrementing said counter until the charge on said timing capacitor reaches a threshold level related to the magnitude of said analog input signal.

8. The combination set forth in claim 7 wherein said programmable interconnecting means comprises switching means for selectively combining said secondary timing signals to form a control signal and a transistor responsive to said control signal for connecting said timing capacitor to a current source during selected ones of said subintervals.

* * * * *